United States Patent [19]
Iwanami et al.

[11] Patent Number: 5,717,643
[45] Date of Patent: Feb. 10, 1998

[54] SEMICONDUCTOR MEMORY DEVICE WITH TESTING FUNCTION

[75] Inventors: Eiichi Iwanami; Toshio Wada, both of Tateyama, Japan

[73] Assignee: Nippon Steel Semiconductor Corporation, Chiba, Japan

[21] Appl. No.: 715,069

[22] Filed: Sep. 19, 1996

[30] Foreign Application Priority Data

Sep. 20, 1995 [JP] Japan .................. 7-266223

[51] Int. Cl.$^6$ .................................. G11C 29/00
[52] U.S. Cl. ...................... 365/201; 365/189.05
[58] Field of Search ...................... 365/201, 200, 365/189.05; 371/21.1, 21.2, 21.3

[56] References Cited

U.S. PATENT DOCUMENTS 5,228,000  7/1993  Yamagata ................. 365/201
5,400,281  3/1995  Morigami ................. 365/201
5,615,166  3/1997  Machida ................. 365/230.08

*Primary Examiner*—Vu A. Le
*Attorney, Agent, or Firm*—Holland & Hart LLP

[57] ABSTRACT

Four I/O pads are allocated to a group from one end to the other. A test circuit is provided for each of the groups. The four I/O pads are only connected to a test data terminal of an IC tester while the rest of the I/O pads are not connected. The test circuit comprises: a test mode detection circuit for detecting the device shifting to the test mode; a test mode writing circuit for writing data inputted from one of the I/O pads into four memory cells; a coincidence circuit for determining whether the data read from the four memory cells coincide with each other; and a data output circuit for outputting the result to the I/O pad.

6 Claims, 3 Drawing Sheets

SEMICONDUCTOR MEMORY DEVICE WITH TESTING FUNCTION

FIELD OF THE INVENTION

The present invention relates to a semiconductor memory such as a dynamic random access memory (DRAM). It particularly relates to a semiconductor memory with a plurality of data input/output terminals.

BACKGROUND OF THE INVENTION

Testing for semiconductor memory chips such as a DRAM is generally done with a testing device called an IC tester. It takes, however, several hundred seconds for an IC tester to test a memory chip. It is important to increase the number of memory chips to be tested with one tester so as to increase productivity. The number of memory chips to be tested depends on the number of pins for control signals like /RAS,/CAS, and /WE and address signals (hereinafter referred to as the number of controls and addresses) as well as the number of pins for inputs/outputs for data (hereinafter referred to as the number of inputs/outputs). The number of memory chips to be tested has been maintained by increasing the number of pins provided for the IC tester. As a result, the number of memory chips to be tested mostly depends on how many controls and addresses are provided for the IC tester when the number of inputs/outputs of a memory chip to be tested is small (one or four).

However, memories with 8, 16 or 32 inputs/outputs are becoming popular in recent years with increasing demand for multiple bits. It is thus the number of inputs/outputs of the IC tester that decides the number of memories to be tested, rather than the number of controls and addresses of the IC tester. For example, the number of memories to be tested is 18 when an IC tester with 72 inputs/outputs tests a memory with 4-pin inputs/outputs while the number of memories to be tested is only 4 to test a memory with 16-pin inputs/outputs. As a result, productivity seriously decreases.

To overcome this problem, the number of inputs/outputs of an IC tester may be further increased to increase the number of memories to be tested. However, the size of the IC tester will be so large that the device cost will increase. Another problem is that the IC tester will not be ready for future increase of inputs/outputs of a memory since there is a limit for the number of inputs/outputs of the tester to be increased.

SUMMARY OF THE INVENTION

The present invention is designed to overcome the problem described above. It is an objective of the invention to provide a semiconductor memory to relieve the limitation of the number of memories to be tested when each memory has a plurality of inputs/outputs and thus improve productivity of memory testing.

A semiconductor memory of the present invention comprises: a) a plurality of input/output terminals for data input and output; b) a means for writing data into a plurality of memory cells wherein data to be written is inputted from one of the input/output terminals; c) a judging means for reading data from each of the plurality of memory cells and judging whether all the data agree with each other, and determining data when the data agree with each other; and d) a means for outputting the determined result to the one of the inputs/outputs terminals.

The semiconductor memory writes data into the plurality of memory cells at the same time via one of the plurality of input/output terminals. It also judges whether the data read from the memory cells at the same time agree with each other, and determines the agreed data to output from the one of the input/output terminals. It is thus possible to test all the memory cells, using only part of the input/output terminals.

The semiconductor memory of the invention further comprises a test mode detection means for detecting whether the mode shifts to a test mode for testing memory cells. The semiconductor memory carries out the memory cell testing as described above after detecting a shift to the test mode with the test mode detection means.

The semiconductor memory is configured such that the test mode detection means detects a shift to the test mode when a given condition for signals is met wherein those signals are the ones inputted to part of control pins for controlling reading from and writing in memory cells and the ones inputted to part of address pins for inputting address signals. The semiconductor memory shifts to the test mode when one or a plurality of control signals and part of address signals meet the given condition.

The condition for the test mode detection means to detect a shift to the test mode is that a write enable signal is active and given data is set to particular two address lines in a CAS before RAS state wherein a column address strobe signal becomes active before a row address strobe signal. The semiconductor memory shifts to the test mode when the condition is met with particular combination of control signals and address signals.

The test mode detection means detects a shift to the test mode when a voltage higher than a normal voltage is applied to a particular one of the control pins and the address pins. The semiconductor memory shifts to the test mode depending on the voltage level applied to the particular pin.

As thus described, the semiconductor memory of the present invention allows data to be written in a plurality of memory cells simultaneously via one of the plurality of input/output terminals. The semiconductor memory also determines whether the data simultaneously read from the memory cells coincide with each other and outputs the result from the one of the input/out terminals. Therefore, all the memory cells can be tested using only part of the input/ output terminals. As a result, the number of memory chips to be tested with an IC tester will increase so that the cost for testing multiple-bit memory chips will be reduced and thus productivity will improve.

DESCRIPTION OF THE PREFERRED EMBODIMENTS

Figure 1:
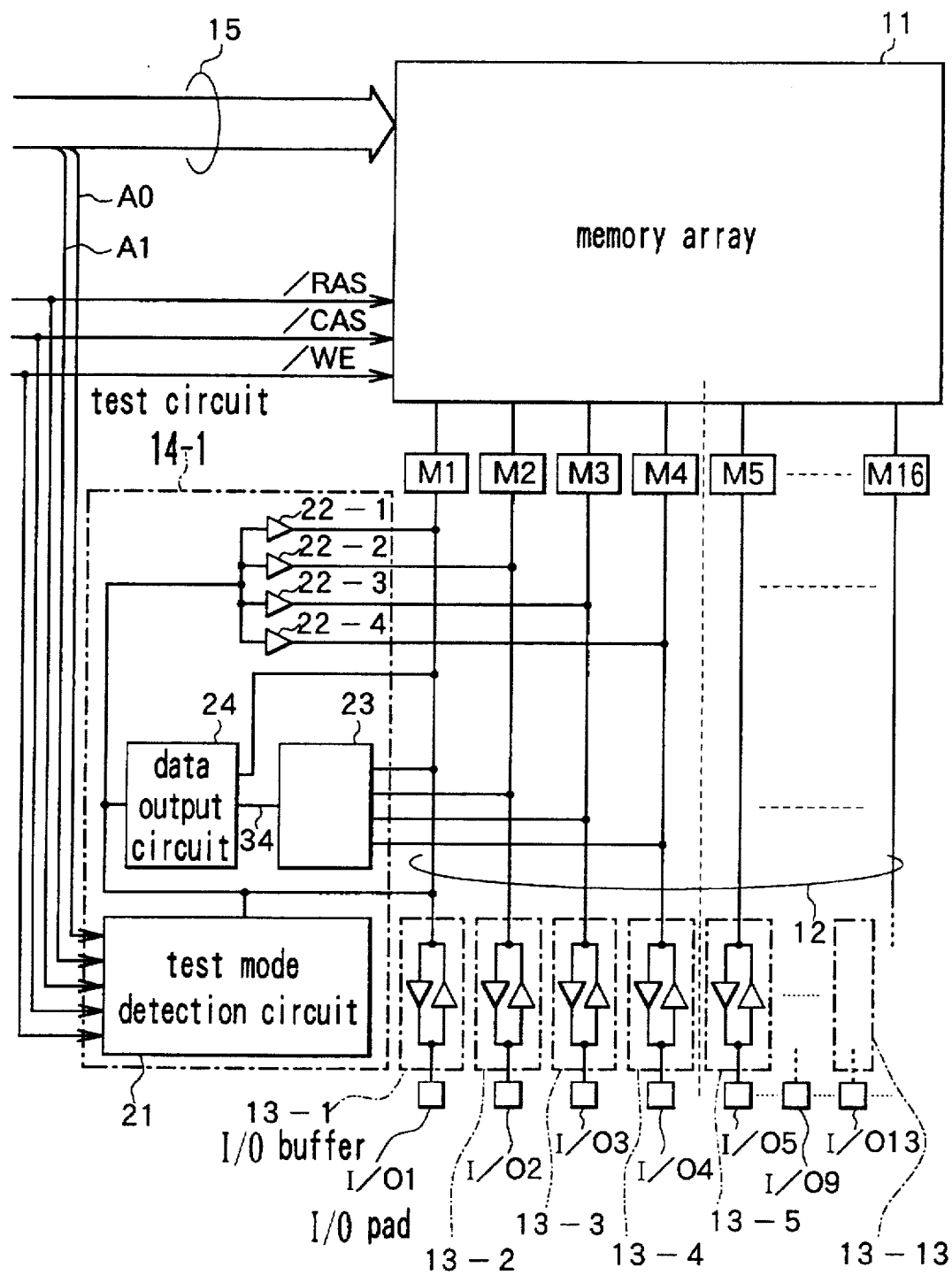
FIG. 1 shows the configuration of a semiconductor memory relating to an embodiment of the invention.

A preferred embodiment of the present invention will now be described in detail with reference to the accompanying drawings. FIG. 1 shows the configuration of the main part of the semiconductor memory relating to a preferred embodiment of the invention. The embodiment will be described, taking a DRAM as an example.

The DRAM comprises: a 16-memory array 11 having a plurality of memory cells; main amplifiers M1 to M16 provided for each bit in the memory array 11; input/output pads I/O 1 to 16 for each bit for data input and output; input/output buffers 13-1 to 13-16, each provided on an input/output bus 12 connecting the main amplifiers M1 to M16 and the I/O pads I/O 1 to I/O 16; and four test circuits 14-1 to 14-4. FIG. 1 shows the test circuit 14-1 only and the other test circuits are omitted. Four of the I/O pads I/O 1 to I/O 16 belong to one of four groups, from one end to the other, from 1 to 4, 5 to 8, 9 to 12 and 13 to 16. Each of the test circuits 14-1 to 14-4 is provided for each of the four groups. In testing, each of the I/O pads I/O 1, I/O 5, I/O 9 and I/O 13 representing each group is only connected to a test data terminal (not shown) of an IC tester while the other I/O pads are not connected to the terminal.

The test circuit 14-1 is provided for the output pads I/O 1 to I/O 4 comprising the first I/O pads group. The test circuit 14-1 comprises: a test mode detection circuit 21 connected to the I/O buffer 13-1; test mode writing circuits 22-1 to 22-4 with the inputs thereof connected together to the I/O buffer 13-1 and each of the outputs thereof connected to the main amplifiers M1 to M4 respectively; a coincidence circuit 23 with the input connected to the main amplifiers M1 to M4; and a data output circuit 24 with one of the inputs thereof connected to the output of the coincidence circuit 23 and the other of the inputs connected to the main amplifier M1 and the output thereof connected to the I/O buffer 13-1.

Figure 2:
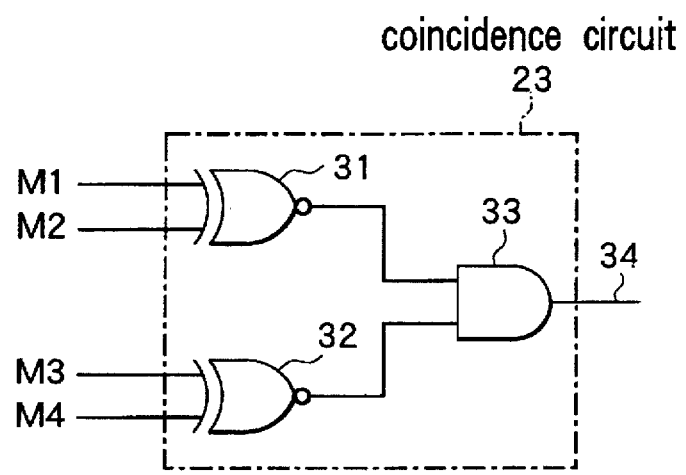
FIG. 2 is a circuit diagram showing the configuration of the coincidence circuit in FIG. 1.

The inputs of the test mode detection circuit 21 are part of address signals 15 to be inputted to the memory array 11 (A0 and A1) and control signals (/RAS,/CAS,/WE) wherein these signals branch into the test mode detection circuit 21. The test mode detection circuit 21 detects the DRAM having shifted to the test mode when these signals meet a given condition. Each of the test mode writing circuits 22-1 to 22-4 is a buffer driver for writing an inputted data from the I/O pad I/O 1 into four memory cells of the memory army 11 at the same time. The coincidence circuit 23 determines whether the data read from the four memory cells of the memory array 11 agree with each other to output a judging signal. The coincidence circuit 23 may be configured with a circuit described hereinafter (FIG. 2). The data output circuit 24 outputs the test result into the I/O buffer 13-1 based on the judging signal from the coincidence circuit 23. The data output circuit 24 may be configured with a circuit described hereinafter (FIG. 3).

FIG. 2 shows the configuration of the coincidence circuit 23 in FIG. 1. As shown in FIG. 2, the coincidence circuit 23 comprises: an EX-NOR circuit 31 wherein the outputs of the main amplifiers M1 and M2 are inputted; an EX-NOR circuit 32 wherein the outputs of the main amplifiers M3 and M4 are inputted; an AND circuit 33 wherein the outputs of the EX-NOR circuits 31 and 32 are inputted. The AND circuit 33 outputs a logic '1' as a judging signal 34 when all of the outputs from the main amplifiers M1 to M4 are '0' or '1' coincidentally. Otherwise, the AND circuit 33 outputs '0'.

Figure 3:
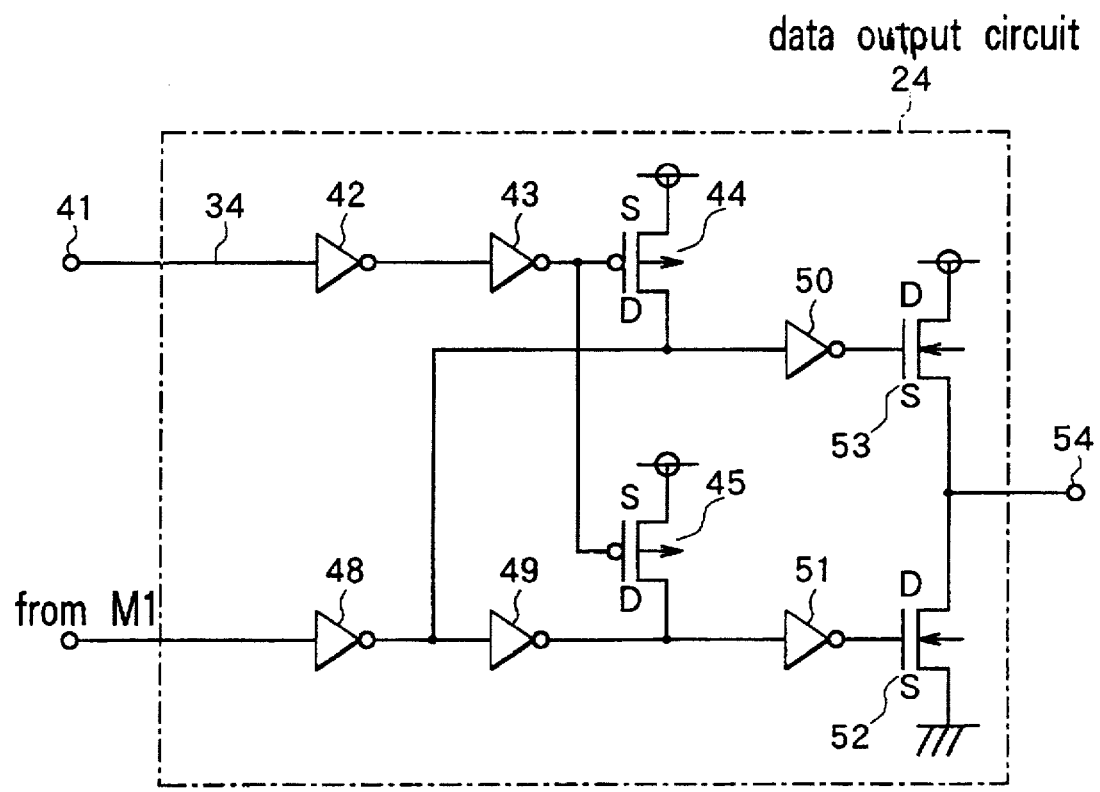
FIG. 3 is a circuit diagram showing the configuration of the data output circuit in FIG. 1.

FIG. 3 shows the configuration of the data output circuit 24 in FIG. 1. The data output circuit 234 comprises: inverters 42 and 43 connected in series to an input terminal 41 to which the judging signal 34 is inputted; pMOS transistors 44 and 45 whose gates are connected to the output of the inverter 43 and whose sources are connected to a power source; an inverter 48 connected to the output of the main amplifier M1; inverters 49 and 50 connected in parallel to the output of the inverter 48; an nMOS transistor 53 whose gate is connected to the output of the inverter 50 and whose drain is connected to the power source; and an nMOS transistor 52 whose gate is connected to the output of the inverter 51 and whose source is connected to ground. The drain of the pMOS transistor 44 is connected to the input of the inverter 50. The drain of the pMOS transistor 45 is connected to the input of the inverter 51. The drain of the nMOS transistor 52 is connected to source of the nMOS transistor 53 and to the output 54 thereof.

The test circuits 14-2, 14-3 and 14-4 are provided for each of the other (the second, third and fourth) groups of I/O pads, each including the I/O pads I/O 5 to I/O 8, I/O 9 to I/O 12 and I/O 13 to I/O 16 respectively. Each of the test circuits 14-2, 14-3 and 14-4 as the same configuration as the test circuit 14-1 and description thereof is omitted.

Figure 4:
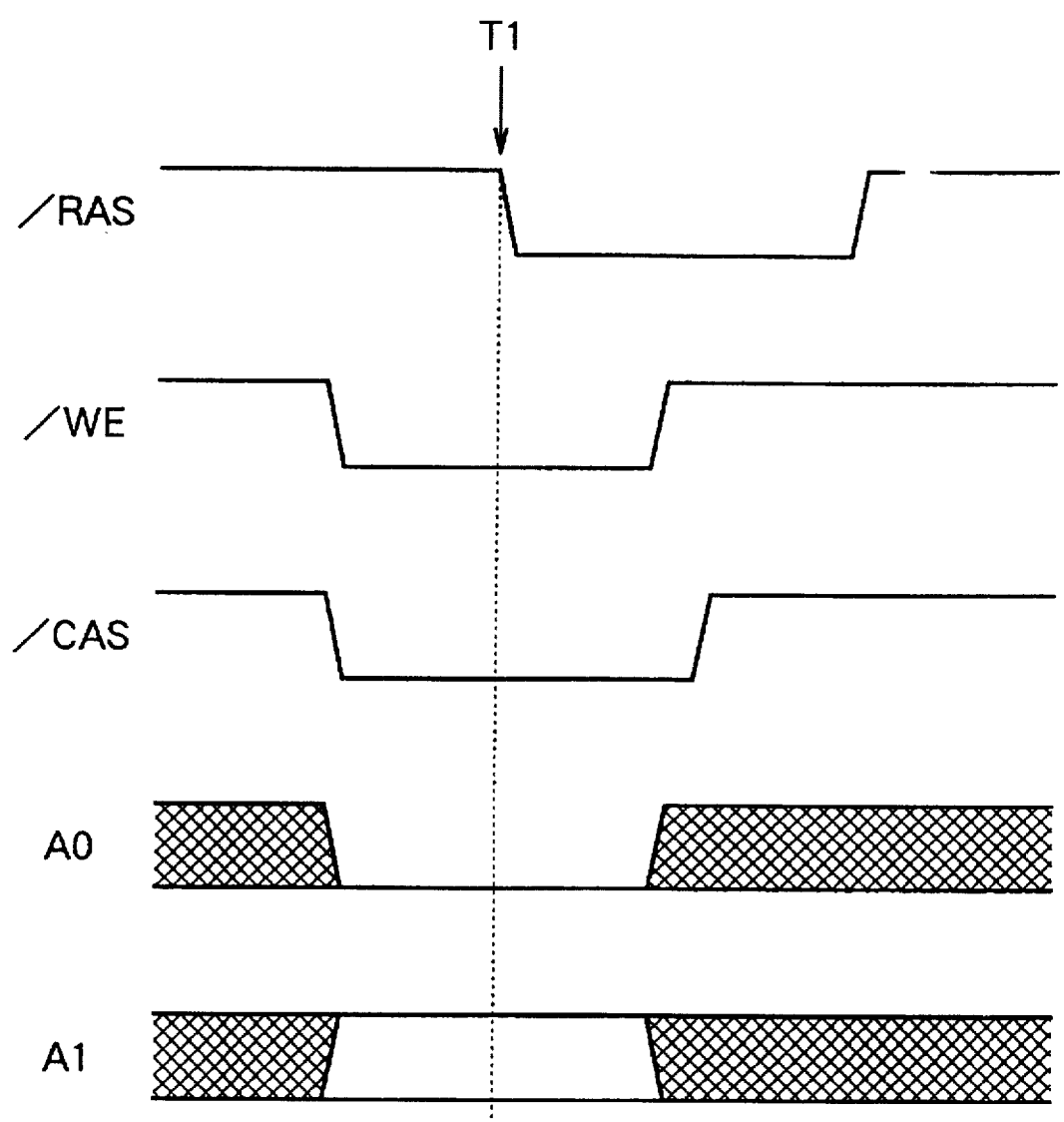
FIG. 4 is a timing chart of the condition for a shift to the test mode.

The operation of the DRAM as above will now be described. The test mode detection circuit 21 detects given data set to particular two address lines in a CAS before RAS state and shifts to the test mode. To be specific, as shown in FIG. 4, two address signals A0 and A1, (d) and (e) in FIG. 4, are set to '0' and '1' respectively and a signal /WE and a signal/CAS, (b) and (c) in FIG. 4, are active (low). When a signal/RAS, (a) in FIG. 4, goes active (low) at T1, the test mode detection circuit 21 detects it and recognizes that the DRAM has shifted to the test mode.

Next, an IC tester (not shown in the figures) inputs '0' or '1' as test data to the I/O pad I/O 1. The inputted data is then inputted to the main amplifiers M1 to M4 via the I/O buffer 13-1 and the test mode writing circuits 22-1 to 22-4, to be written into four memory cells in the memory array 11 simultaneously.

Similarly, test data inputted from each of the I/O pads I/O 5, I/O 9 and I/O 13 is simultaneously written into four memory cells via the test mode writing circuit of each of the test circuits 14-2, 14-3 and 14-4 (not shown) respectively. Test data ('0' or '1') simultaneously inputted from the I/O pads I/O 1, I/O 5, I/O 9 and I/O 13 may be either the same or not.

Having finished writing test data into the memory cells, the written data will be read out. The data read from the four memory cells of the memory array 11 is inputted to the coincidence circuit 23 via the main amplifiers M1 to M4. The coincidence circuit 23 determines whether the four data agree with each other or not and outputs the result to the data output circuit 24. To be specific, a logic '1' is outputted as the judging signal 34 when all the data is '0' or '1' to coincide with each other. Otherwise, '0' is outputted.

When the four data coincide with each other upon judgment of the coincidence circuit 23, a judging signal '1' is inputted to the input terminal 41 of the data output terminal 24 in FIG. 3 so as to turn off both pMOS transistors 44 and 45. If all of the four data is '1', data '1' is inputted from the main amplifier M1 so as to turn off the transistor 52 and to turn on the transistor 53, and data '1' is outputted from the output terminal 54. If all of the four data is '0', data '0' is inputted from the main amplifier M1 so as to turn on the transistor 52 and to turn off the transistor 53, and data '0' is outputted from the output terminal 54.

When the four data do not coincide with each other, a judging signal '0' is inputted to the input terminal 41 of the data output terminal 24 in FIG. 3 so as to turn on both pMOS transistors 44 and 45. As a result, both nMOS transistors 52 and 53 turn off and the impedance at the output terminal 54 goes high.

The data result outputted from the data output circuit 24 is outputted from the I/O pad I/O 1 via the I/O buffer 13-1. The IC tester (not shown) determines whether the four memory cells tested pass or fail based on the data result. That is, when the data result is '1', data '1' is read from all of the four memory cells where data '1' is written so that the written data coincides with the read data. When the data result is '0', data '0' is read from all of the four memory cells where data '0' is written so that the written data coincides with the read data. When the data result is of high impedance, it is determined that the data do not coincide, that is, a memory error (a writing or a reading error) has occurred.

Similarly, each of the other test circuits 14-2 to 14-4 outputs the data result for the four memory cells to be inputted to the IC tester via each of the I/O pads I/O 5, I/O 9 and I/O 13. The IC tester determines whether each of the four memory cells being tested pass or fail. This embodiment thus allows only four of the sixteen I/O pads to test all the memory cells so as to determine the quality of the chip. As a result, the number of memory chips to be tested is effectively increased for a multiple-bit DRAM of 16 bits. In this embodiment, a shift to the test mode is detected when the state shifts to the CAS before RAS while the address signals A0 to A1 are set to the given values. The present invention is, however, not limited to the embodiment described above but may be practiced in still other ways without departing from the scope of the invention. For example, a condition for a shift to the test mode may be an application of a voltage (like 10V) higher than normal power supply (3 to 5V) to a particular signal, for example, at least one of the control signals like/RAS,/CAS,/WE,/OE and the address signal. In this case, only the particular signal need be inputted to the test mode detection circuit 21 besides the memory array 11.

The present invention is not limited to a 16-bit DRAM. For an 8-bit DRAM, for example, four of the I/O pads I/O 1, I/O 3, I/O 5 and I/O 7 are used wherein two memory cells are tested through one of the I/O pads. For a 32-bit DRAM, four of the I/O pads I/O 1, I/O 9, I/O 17 and I/O 25 are used wherein eight memory cells are tested through one of the I/O pads. Furthermore, the invention is not limited to a DRAM but may be applied to other semiconductor memories such as a SRAM, ROM, EEPROM and flash memory

What is claimed is:

1. A semiconductor memory comprising:

a) a plurality of input/output terminals for data input and output;

b) a means for writing data into a plurality of memory cells wherein data to be written is inputted from one of said input/output terminals;

c) a judging means for reading data from each of said plurality of memory cells and judging whether all the data agree with each other and d) a means for supplying an output indicating whether all the data agree with each other as determined by said judging means to the one of said input/out terminals; wherein all the memory cells are tested, using only part of said input/output terminals.

2. A semiconductor memory according to claim 1, further comprising a test mode detection means for detecting a shift to a test mode for testing said memory cells.

3. A semiconductor memory according to claim 2 wherein said test mode detection means detects a shift to the test mode when a given condition for signals is met wherein said signals are the ones inputted to part of control pins for controlling reading from and writing in said memory cells, and the ones inputted to part of address pins for inputting address signals.

4. A semiconductor memory according to claim 3 wherein said condition for the test mode detection means to detect a shift to the test mode is that a write enable signal is active and given data is set to particular two address lines in a CAS before RAS state wherein a column address strobe signal becomes active before a row address strobe signal.

5. A semiconductor memory according to claim 3 wherein said test mode detection means detects a shift to the test mode when a voltage higher than a normal voltage is applied to a particular one of said control pins and address pins.

6. A semiconductor memory comprising:

a) a plurality of input/output terminals for data input and output;

b) a means for writing data into a plurality of memory cells wherein data to be written is inputted from one of said input/output terminals;

c) a judging means for reading data from each of said plurality of memory cells and judging whether all the data agree with each other, and for identifying the data if the data agree with each other; and d) a means for supplying an output indicating whether all the data agree with each other and an output indicating the data if the data agree with each other, each of said outputs determined by said judging means to the one of said input/out terminals, wherein all the memory cells are tested, using only part of said input/output terminals.

* * * * *